United States Patent
Edwards et al.

(10) Patent No.: US 7,267,861 B2
(45) Date of Patent: Sep. 11, 2007

(54) SOLDER JOINTS FOR COPPER METALLIZATION HAVING REDUCED INTERFACIAL VOIDS

(75) Inventors: Darvin R. Edwards, Garland, TX (US); Tz-Cheng Chiu, Plano, TX (US); Kejun Zeng, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 29 days.

(21) Appl. No.: 11/140,785

(22) Filed: May 31, 2005

(65) Prior Publication Data

US 2006/0267157 A1    Nov. 30, 2006

(51) Int. Cl.
*H01L 23/532* (2006.01)
(52) U.S. Cl. .............. 428/209; 428/647; 428/675; 257/779; 438/612; 438/687
(58) Field of Classification Search .......... None
See application file for complete search history.

(56) References Cited

U.S. PATENT DOCUMENTS

| | | | | |
|---|---|---|---|---|
| 5,614,328 A | * | 3/1997 | Suzuki et al. ............ | 428/647 |
| 6,096,648 A | * | 8/2000 | Lopatin et al. ........... | 438/687 |
| 6,242,349 B1 | * | 6/2001 | Nogami et al. ........... | 438/687 |
| 6,429,523 B1 | * | 8/2002 | Andricacos et al. ...... | 257/758 |
| 6,506,668 B1 | * | 1/2003 | Woo et al. ............... | 438/584 |
| 6,656,836 B1 | * | 12/2003 | Wang et al. .............. | 438/653 |
| 6,692,588 B1 | * | 2/2004 | Uzoh et al. .............. | 148/516 |
| 2003/0232498 A1 | * | 12/2003 | Harada .................... | 438/637 |
| 2004/0009654 A1 | * | 1/2004 | Abe ........................ | 438/622 |
| 2004/0219779 A1 | * | 11/2004 | Basol et al. ............. | 438/627 |
| 2006/0094237 A1 | * | 5/2006 | Lin et al. ................. | 438/653 |
| 2006/0113685 A1 | * | 6/2006 | Ueki et al. ............... | 257/785 |

* cited by examiner

*Primary Examiner*—John J. Zimmerman
(74) *Attorney, Agent, or Firm*—Yingsheng Tung; Wade James Brady, III; Frederick J. Telecky, Jr.

(57) ABSTRACT

A metal interconnect structure (100) comprising a bond pad (101), which has copper with at least 70 volume percent composed of crystal grains expanding more than 1 μm in their main direction, and 30 or less volume percent composed of crystal grains, which expand less than 1 μm in their main crystal direction. A body (102) of tin alloy is in contact with the bond pad.

17 Claims, 2 Drawing Sheets

SOLDER JOINTS FOR COPPER METALLIZATION HAVING REDUCED INTERFACIAL VOIDS

FIELD OF THE INVENTION

The present invention is related in general to the field of semiconductor devices and more specifically to a structure and method of controlling metal interdiffusion and interfacial voids in solder interconnections in order to improve device reliability.

DESCRIPTION OF THE RELATED ART

When integrated circuits on semiconductor chips are to be interconnected to external circuitry on a substrate using reflow materials such as solder, the parts to be assembled have to undergo at least one temperature rise to above the melting temperature of the reflow material, followed by a cooling cycle. After completing this process, the finished assembly often has to be subjected to annealing steps, consisting typically of repeated temperature swings for an extended period of time. Finally, the assembled parts frequently have to be tested to determine their reliable functioning after repeated exposure to failure-accelerating conditions such as extreme temperature excursions and/or elevated humidity.

The failure mechanisms studied since the early development of reflow-assembled parts in the late 1960s (spearheaded by IBM) predominantly were stress-induced joint fatigue, creep and cracking. Similarly, stress-initiated failures have been at the center of research attention for complete device packages assembled on external parts using reflow materials such as solder. Over the years, relatively little attention has been directed towards the progressive changes in the assembly joints caused by intermetallic effects such as metal interdiffusions, compound formation, and lattice mismatches. These changes are particularly pronounced for certain metals, as recent experimental results have clearly shown; the changes are caused by metal interdiffusions and lead to irreversible intermetallic changes. The changes may contribute significantly to diminished reliability of reflow-assembled parts.

Since the introduction of copper as interconnecting metallization in integrated circuits, copper pads in direct contact with solder have been found to exhibit vulnerabilities affecting the reliability of solder joints. Especially, the rapid formation of interfacial voids such as Kirkendall voids weakens the solder interface during thermal aging. The favorite solution has been the implementation of a nickel layer as a diffusion barrier between copper and solder to limit the solder reaction.

The electroless process, however, commonly used for depositing the nickel introduced a problem of its own, the black pad caused by the galvanic corrosion of the electroless nickel plating during the immersion gold plating. Copper surface finishes proposed so far as alternatives disappear in direct copper/solder contacts. As examples, an organic surface protection film will evaporate at the high temperature needed for solder reflow; a thin layer of gold will be dissolved into the molten solder; a thin layer of tin will also be dissolved into the molten solder; similarly, an original thin solder film will be dissolved.

SUMMARY OF THE INVENTION

Applicants recognize a need for a straightforward solution to improve the reliability of direct copper/solder contacts. A careful investigation has been conducted to study the interface between copper and solder under the long term influence of elevated temperatures or repeated temperature cycles, commonly referred to as "aging". This investigation has the conditions identified under which, after aging, a large amount of voids has formed at the interface between solder and copper, which greatly decreases the interfacial strength of the intermetallic joint.

Intermetallic compounds (IMCs) are generated when two or more metals interdiffuse. Voids occur when one metal (e.g., copper) diffuses faster into a second (e.g., solder) than the second diffuses into the first, leaving vacancies behind in the first metal. If sufficient quantity of the first metal diffuses into the second, voids can result. For the case of copper and solder, the diffusion inequality is also a function of the metals used in the solder. For semiconductor devices, the inequality is building up under the conditions of repeated temperature cycles, high temperature storage (i.e., at temperatures >100° C.), and device working temperatures of >100° C.

The results of experiments performed by the applicants indicated that the diffusion rate of one species into another is controlled by the crystal grain structure of the metals. Metal atoms migrate more rapidly along grain boundaries than they do through the crystal of the material due to the lower free energy state of metal atoms along the grain boundaries. Thus, grain boundaries supply a ready source of atoms to IMC, resulting in depletion along the grain boundaries. Since grain boundaries supply some percentage more atoms to the IMC than do the exposed crystal faces, the rate of formation of the IMCs are controllable by adjusting the grain structure of the diffusing metal species.

The investigations of the applicants showed that by increasing the grain size of the copper layer, the rate of copper diffusion can be slowed, thus slowing the formation of voids. Copper layers are often formed by plating copper onto a thin seed layer, for example on a polymer film. Since copper plates nearly epitaxially, the grain size of the seed layer has to be increased, for instance by annealing through baking or through laser heating, before the plating step.

One embodiment of the present invention is a metal interconnect structure comprising a bond pad, which has copper with at least 70 volume percent composed of crystal grains expanding more than 1 µm in their main direction, and 30 or less volume percent composed of crystal grains, which expand less than 1 µm in their main crystal direction. A body of tin alloy is in contact with the bond pad.

Another embodiment of the invention is a semiconductor device, which comprises a substrate, preferably a polymer tape, having first and second surfaces. The first surface has a bond pad, which comprises copper; at least 70 volume percent of the copper is composed of crystal grains, which expand at least 1 µm in their main direction, and 30 or less volume percent composed of crystal grains, which expand less than 1 µm in their main direction. A semiconductor chip is assembled on the first substrate surface. A body of tin alloy on the second substrate surface is in contact with the bond pad.

Another embodiment of the invention is a method for fabricating a metal interconnect structure. First, a substrate is provided and an area for fabricating a bond pad is selected. Then, a seed layer of copper, preferably about 50 to 200 nm thick is deposited onto the pad area. The seed layer is annealed for a controlled time, preferably from about 20 to 180 min, at a controlled temperature, preferably between about 100 to 240° C., to create a predetermined concentration of copper crystals of a predetermined crystal size. The concentration is preferably at least 70 volume percent, and the crystal size is preferably at least 1 µm in the main crystal direction. A copper layer is deposited, preferably epitaxially, onto the annealed seed layer. Finally, a body of tin alloy is attached to the copper layer in the pad area.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
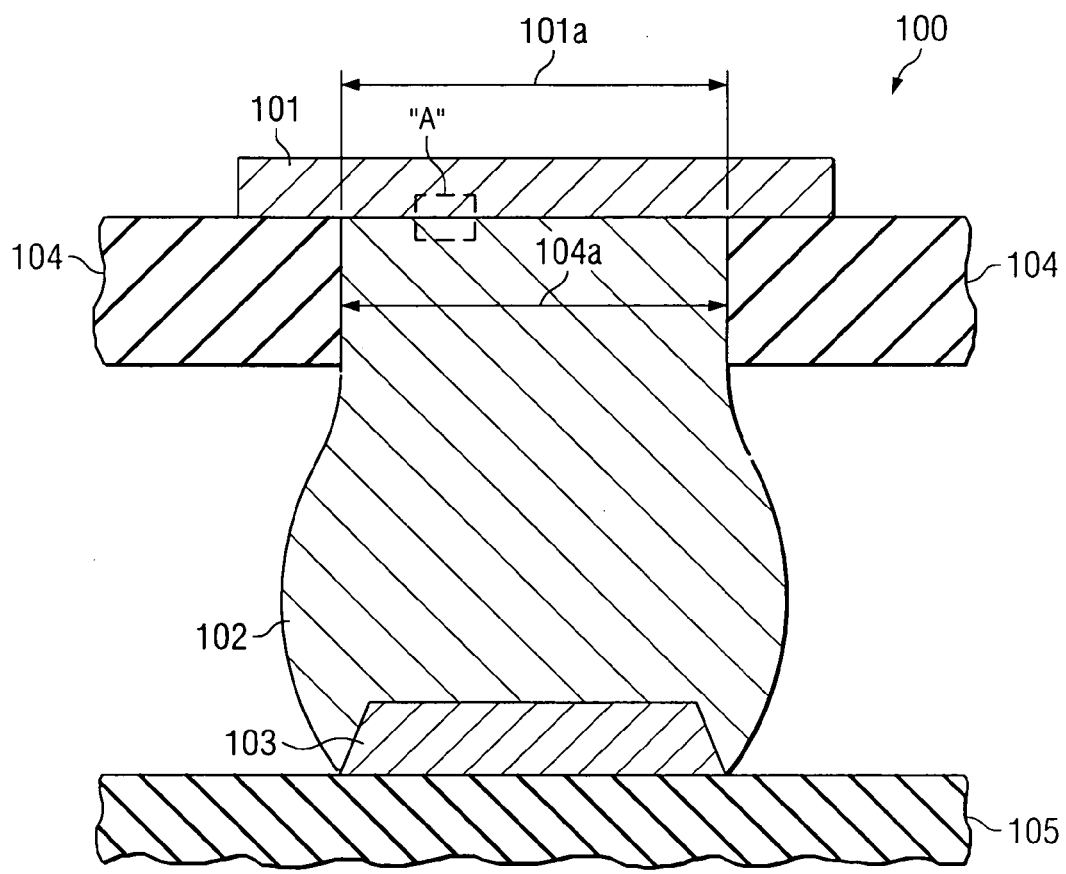
FIG. 1 illustrates a schematic cross section of a metal interconnect (especially solder) structure between a substrate bond pad portion and an external part portion. The portion marked "A" is magnified in FIGS. 2 and 3.

The schematic cross section of FIG. 1 illustrates an embodiment of the invention, a metal interconnect structure generally designated 100 as it is used in principle in many assemblies. The structure comprises a metal line 101, which provides the first contact pad 101a, a body of solder 102, and a second contact pad 103. At least one of the contact pads is made of copper; for example, if line 101 is made of copper, contact pad 101a is copper. In many embodiments, both contact pads of the interconnect structure are made of copper. In the example of FIG. 1, metal line 101 is supported by an insulating carrier 104. A window of width 104a in carrier 104 allows the solder of body 102 to be attached to the surface region of copper line 101 across pad width 101a. Contact pad 103 is also supported by a carrier, designated 105; frequently, carrier 105 is an external part, such as a printed circuit board made of insulating material.

The copper of line 101 and thus contact pad 101a has at least 70 volume percent composed of crystal grains, which expand at least 1 µm in their main direction, and 30 or less volume percent composed of crystal grains, which expand less than 1 µm in their main direction. The copper of pad 103 is also preferably made of large-size crystals, preferably at least 70 volume percent composed of crystal grains, which expand at least 1 µm in their main direction, and 30 or less volume percent composed of crystal grains, which expand less than 1 µm in their main direction.

Preferred solder materials for attachment body 102 include solders made of tin and tin alloys. Because of the low melting temperatures they offer, eutectic tin compounds are particularly preferred. Examples are tin/silver (eutectic temperature 221° C.), tin/bismuth (139° C.), tin/indium (120° C.), tin/zinc (189.5° C.), and tin/lead (183° C.). Compared to these alloys, the melting point of pure tin is at 231.9° C. For reasons of manufacturability and joint strength, the most preferred solder compound is tin/silver and tin/silver/copper.

During the reflow process, and during extended time periods at elevated temperatures, solder and copper form intermetallic compounds generated by the interdiffusion of the metals. Details of the metal interdiffusion and intermetallic formation have been studied by the applicants; see Tz-Cheng Chiu et al., "Effect of thermal aging on board level drop reliability for Pb-free BGA packages", Proc. 54$^{th}$ Electronic Comp. and Techn. Conf., pp. 1256-1262, 2004; Kejun Zeng et al., "Kirkendall void formation in eutectic SnPb solder joints on bare Cu. and its effect on joint reliability", J. Appl. Phys. 97, pp. 024508-1 to 024508-8, 2005.

The applicants discovered that a high density of voids represents a significant mechanical weakening of the joint; a dense row of voids is at risk of developing into a crack. Devices with voids along the copper/solder joint (developed after aging, or numerous temperature cycles, or insufficiently cooled device operation, etc.) have a high failure rate in bulk solder pull tests and board-level drop tests.

The investigations by the applicants have shown that voids occur when one metal (e.g., copper) diffuses faster into the second (e.g., solder) than the second diffuses into the first, leaving vacancies behind in the first metal. If sufficient quantity of the first metal diffuses into the second, voids can result. In the case of copper to solder, especially lead-free solder, the copper diffuses more rapidly into the tin/silver, etc., solder than does the tin into the copper.

Furthermore, experimental results by the applicants indicate that the diffusion rate of copper into solder is controlled by the crystal grain structure of copper. Metal atoms migrate more rapidly along grain boundaries than they do through the crystal of the material due to the lower free energy state of metal atoms along the grain boundaries. Thus, grain boundaries supply a ready source of copper atoms to the intermetallic compounds, resulting in depletion along the grain boundaries. Since grain boundaries supply some percentage more copper atoms to the intermetallic compound than do the exposed crystal faces, the rate of formation of the intermetallic compounds are controllable by adjusting the grain structure of the diffusing metal species.

Figure 2:
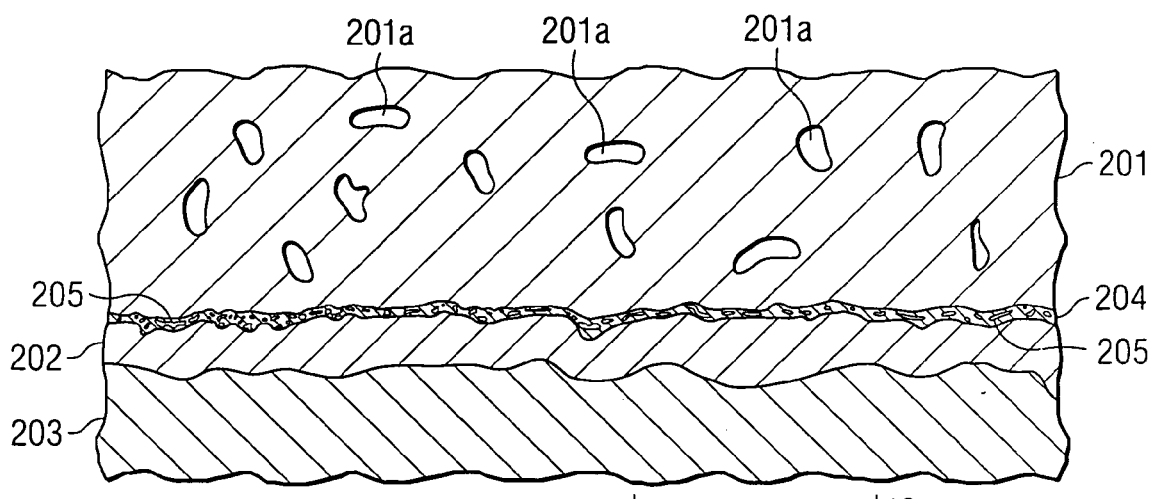
FIG. 2 is a micro-photograph of a metallurgical cross section of portion "A" in FIG. 1 after aging, when the bond pad portion comprises small crystallites.
Figure 3:
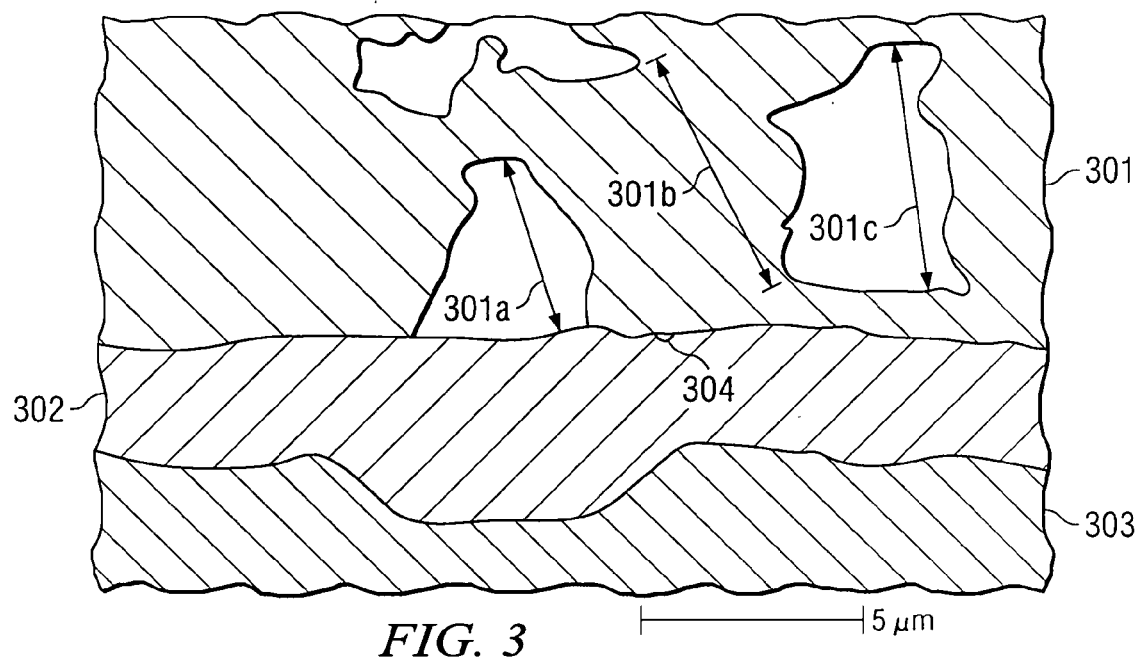
FIG. 3 is a micro-photograph of a metallurgical cross section of portion "A" in FIG. 1 after aging, when the bond pad portion comprises large crystallites according to the invention.

Examples of the effect of the copper crystal grain size on void formation are reproduced in the microphotographs of FIGS. 2 and 3. Solder bodies forming joints with copper pads were aged for a time period of 40 days at 125° C.; the joints were then cross sectioned and a small portion ("A" in FIG. 1) photographed at high magnification. In the microphotograph of FIG. 2, the region 201 is the copper of the contact pad, in which the copper has approximately 70 volume percent composed of crystal grains 201a, which expand less than 1 µm in the main crystal direction (small crystal grain size). 202 is the intermetallic region of copper and solder (such as $Cu_3Sn$ and $Cu_6Sn_5$). 203 is the tin alloy of the solder. As the photograph clearly shows, numerous voids 204 have formed along the solder joint; some voids may even grow together (205).

In contrast, a solder joint formed with a copper pad, which has the crystal grain structure according to the invention, displays only minimal void formation. In the microphotograph of FIG. 3, the region 301 is the copper of the contact pad, in which the copper has at least 70 volume percent composed of crystal grains, which expand at least 1 µm in the main crystal direction (large crystal grain size), and 30 or less volume percent composed of crystal grains, which expand less than 1 μm in their main direction. Some examples of large crystal directions are designated 301a, 301b, and 301c. 302 is the intermetallic region of copper and solder (mostly tin). 303 is the tin alloy of the solder. As the microphotograph of FIG. 3 demonstrates, only rarely has a void 304 formed along the solder joint. An analysis of cross sections of several samples indicates that not more than 1 void per 50 μm$^2$ forms after an aging time of 40 days at 125° C. Consequently, the reliability of the joint will be high.

Referring now to FIG. 1, analogous considerations apply for the void formation along the interface of the tin alloy body 102 and the copper contact pad 103 of the external part. The number of voids can be kept to a minimum, when copper pad 103 is made of large-size crystallites.

Another embodiment of the invention is a method of fabricating a metal interconnect structure resulting in a high reliability solder joint for copper metallization. In the first step, a substrate is provided and an area for fabricating a bond pad is selected. When the substrate is to serve as the carrier 104 in FIG. 1, a preferred material is a polyimide tape.

Next, a seed layer of copper is deposited onto the pad area. A preferred method of deposition is a plasma deposition technique. The seed layer has preferably a thickness in the range from about 50 to 200 nm.

The seed layer is then annealed for a controlled period of time at a controlled temperature to create a predetermined concentration of copper crystals of a predetermined crystal size. For longer-time annealing, a suitable technique is baking the substrate with the seed layer; for quicker annealing, laser heating of the seed layer is practiced. For most seed layers, the annealing temperature is between about 100 and 240° C. and the annealing time period between about 20 to 180 min. Since the goal of the annealing step is to create large-grain crystal seeds, seed layers with micro-crystalline grains will typically need longer times and higher temperatures for developing large-crystal grains. This is particularly true when the substrate is amorphous, as for polyimide substrates.

In the preferred embodiments, the predetermined crystal size for the copper is at least 1 μm in the main crystal direction. The predetermined copper crystal concentration is at least 70 volume percent.

Next, a copper layer (101 in FIG. 1) of the desired thickness is deposited onto the annealed seed layer. Preferably, the copper layer thickness is between about 10 and 30 μm. The preferred deposition technique is a plating technique, because it allows the copper to grow approximately epitaxially onto the annealed seed layer.

The copper contact pad 103 on the external part 105 in FIG. 1 is preferably made in the following fashion. The copper to be used for pad 103 is first plated as a layer to the desired thickness onto a stainless steel drum and later transferred and adhered to the external part 105 (as stated above, part 105 is frequently a printed circuit board made of insulating material such as polyimides, glass ceramics, FR-4 and other composites). The desired pattern of layer 103 is then obtained by etching the copper layer to create copper traces. By selecting a large-grain stainless surface, the plated copper can be made to first conform to the grain structure of the drum epitaxially and then to form a columnar structure, resulting in a layer composed of the desired large-grain copper. Additionally, the copper film can be annealed for any length of time to grow the grains. Care should be taken, of course, with the final copper layer to avoid cold working, which could damage the large grain structure.

After a window (101a in FIG. 1) has then been etched in the polymeric tape (104) to expose a portion of the large-crystal copper, a body (102) of tin alloy is attached to the exposed copper layer across the whole window area by reflowing the tin alloy. As illustrated in FIG. 3, the resulting joint between the copper layer and the solder intermetallic will have only very few voids due to the large-size copper cystallites of the copper layer.

In a second reflow step, the body (102) of tin alloy is attached to the respective copper contact pad (103) of the external part (105). Since this contact pad was formed from a copper layer with large-crystal copper grains, the second reflow step will also create a joint with the intermetallic with only a minimal number of voids. Consequently, the joint exhibits excellent reliability.

Another embodiment of the invention is an assembled device, especially a semiconductor device. In a broad sense, this invention applies to any product, in which reflow joints are used, or where the reliability of those joints is essential for the successful application of the product. The invention applies to encapsulated products as well as to flip-chip assembled devices; the invention applies to packaged and unpackaged products as long as reflow metals on copper metallization are employed.

Figure 4:
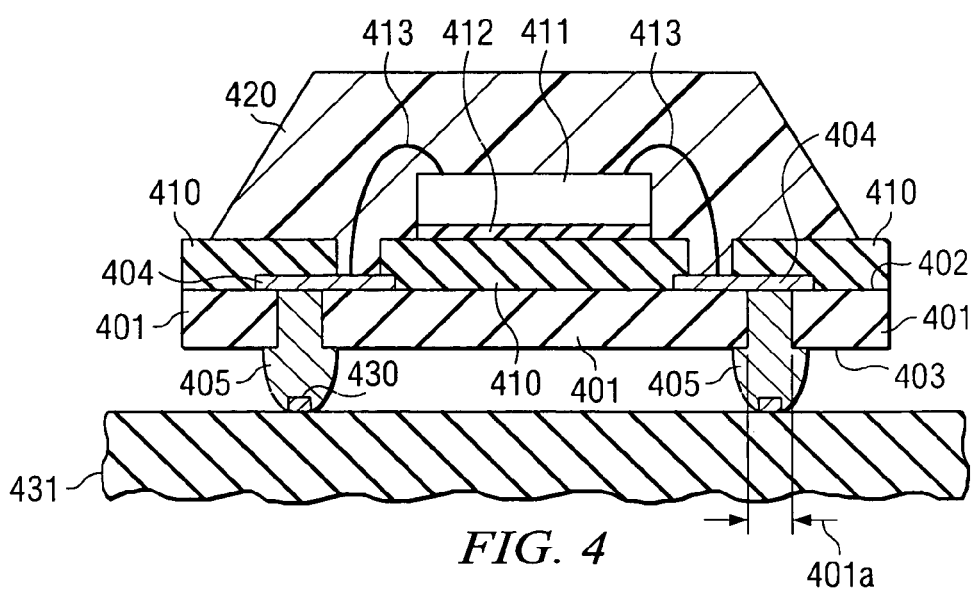
FIG. 4 is a schematic cross section through a semiconductor device, which includes an embodiment of the invention.

One example out of the wide variety of products is a Ball-Grid Array device on a printed circuit board, for instance the MicroStarBGA™ (μ*BGA™) of Texas Instruments Incorporated, U.S.A. This device is schematically depicted in the cross section of FIG. 4. A substrate 401, such as a polymer tape (for instance, made of polyimide), has first and second surfaces, 402 and 403 respectively. First surface 402 has a plurality of bond pads 404, which consist of copper; this copper is at least 70 volume percent composed of crystal grains, which expand at least 1 μm in their main direction, and 30 or less volume percent composed of crystal grains, which expand less than 1 μm in their main direction. The device further comprises a plurality of reflow bodies 405 on the second substrate surface 403; the reflow bodies are preferably made of a tin alloy. Holes 401a in the substrate allow each reflow body 405 to contact its respective bond pad 404 on the first substrate surface 402.

Attached to the first substrate surface 402 is an insulating layer 410 (for instance, made of the insulators often used as solder mask), onto which the semiconductor chip 411 is mounted with adhesive material 412 (preferably an epoxy). Insulating layer 412 has holes to expose portions of the bond pads 404. Wire bonds 413 connect chip contact pads with the exposed portions of bond pads 404. Chip 411 and wires 413 are encapsulated by mold compound 420.

Each reflow body 405 is attached to a corresponding contact pad 430 of an external part 431. Preferably, contact pads 430 are made of copper; this copper is at least 70 volume percent composed of crystal grains, which expand at least 1 μm in their main direction, and 30 or less volume percent composed of crystal grains, which expand less than 1 μm in their main direction. The use of large-crystallite copper assures a reliable solder joint, since only very few voids are being formed in the attachment (reflow) process or in subsequent aging processes.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A metal interconnect structure comprising:
a bond pad comprising copper having at least 70 volume percent composed of crystal grains, which expand at least 1 μm in their main direction, and 30 or less volume percent composed of crystal grains, which expand less than 1 μm in their main direction; and a body of one of eutectic tin/lead solder, eutectic tin/bismuth solder, and eutectic tin/zinc solder in contact with said bond pad.

2. A metal interconnect structure comprising:
a bond pad comprising copper having at least 70 volume percent composed of crystal grains, which expand at least 1 μm in their main direction, and 30 or less volume percent composed of crystal grains, which expand less than 1 μm in their main direction; and a body of eutectic tin/silver solder in contact with said bond pad.

3. A metal interconnect structure comprising:
a bond pad comprising copper having at least 70 volume percent composed of crystal grains, which expand at least 1 μm in their main direction, and 30 or less volume percent composed of crystal grains, which expand less than 1 μm in their main direction; and a body of tin/silver/copper solder in contact with said bond pad.

4. A semiconductor device comprising:
a substrate having first and second surfaces, said first surface having a bond pad comprising copper having at least 70 volume percent composed of crystal grains, which expand at least 1 μm in their main direction, and 30 or less volume percent composed of crystal grains, which expand less than 1 μm in their main direction;
a body of tin alloy on said second substrate surface in contact with said bond pad on said first substrate surface through a hole in said substrate; and
a semiconductor chip assembled on the side of said first substrate surface.

5. The device according to claim 4 wherein said substrate is a polymer tape.

6. A method for fabricating a metal interconnect structure, comprising the steps of:
providing a substrate and selecting an area for fabricating a bond pad;
depositing a seed layer of copper onto said pad area;
annealing said seed layer for a controlled time at a controlled temperature to grow a predetermined concentration of copper crystals of a predetermined crystal size;
depositing a copper layer onto said annealed seed layer; and
attaching a body of tin alloy solder with an alloy reflow step to said copper layer in said pad area.

7. The method according to claim 6 wherein said substrate is a polyimide tape.

8. The method according to claim 6 wherein said substrate is a stainless steel material selected for its pre-determined large-grained crystal surface.

9. The method according to claim 6 wherein said step of depositing said seed layer uses a plasma deposition technique.

10. The method according to claim 6 wherein said seed layer has a thickness in the range from about 50 to 200 nm.

11. The method according to claim 6 wherein said step of annealing comprises a temperature between about 100 and 240° C. and a time period form about 20 to 180 min.

12. The method according to claim 11 wherein said step of annealing is performed by baking.

13. The method according to claim 11 wherein said step of annealing is performed by laser heating.

14. The method according to claim 6 wherein said predetermined crystals size is at least 1 μm in the main crystal direction, and said predetermined crystal concentration is at least 70 volume percent.

15. The method according to claim 6 wherein said step of depositing a seed layer is an epitaxial deposition.

16. The method according to claim 6 wherein said step of depositing a copper layer uses a plating technique.

17. The method according to claim 6 wherein said deposited copper layer has a thickness in the range from about 10 to 30 μm.

* * * * *